United States Patent [19]

Kuo et al.

[11] Patent Number: 5,222,255
[45] Date of Patent: Jun. 22, 1993

[54] INTERMODULATION CONTROLLER FOR RADIO RECEIVER

[75] Inventors: Yao H. Kuo, Canton; John F. Kennedy, Garden City, both of Mich.

[73] Assignee: Ford Motor Company, Dearborn, Mich.

[21] Appl. No.: 740,243

[22] Filed: Aug. 5, 1991

[51] Int. Cl.$^5$ .................... H04B 7/00; H04B 1/10
[52] U.S. Cl. .................... 455/266; 455/200.1; 455/295; 455/296; 455/307
[58] Field of Search .......... 455/266, 180.1, 182.3, 455/184.1, 200.1, 295, 296, 307; 375/12, 97

[56] References Cited

U.S. PATENT DOCUMENTS

| | | | |
|---|---|---|---|
| 2,923,814 | 2/1960 | Smith-Vaniz, Jr. | 455/307 |
| 2,998,517 | 8/1961 | Beckerich | 455/266 |
| 4,267,596 | 5/1981 | Lowenschuss | 455/18 |
| 4,355,414 | 10/1982 | Inoue | 455/184 |
| 4,388,731 | 6/1983 | King | 455/221 |
| 4,412,350 | 10/1983 | Miedema | 455/306 |
| 4,654,884 | 3/1987 | Sakai et al. | 455/183 |
| 4,794,635 | 12/1988 | Hess | 455/33.3 |
| 5,001,776 | 3/1991 | Clark | 455/226 |

FOREIGN PATENT DOCUMENTS

| | | |
|---|---|---|
| 2803979 | 1/1978 | Fed. Rep. of Germany . |
| 3927873 | 8/1989 | Fed. Rep. of Germany . |
| 1593834 | 7/1981 | United Kingdom . |

Primary Examiner—Reinhard J. Eisenzopf
Assistant Examiner—Christine K. Belzer
Attorney, Agent, or Firm—Mark Mollon; Roger L. May

[57] ABSTRACT

The radio receiver of the present invention detects the presence of intermodulation distortion interference above an objectionable level and shifts a tunable RF passband in a manner to reduce or eliminate the intermodulation distortion interference without reducing the level of the desired signal to below a predetermined level. Intermodulation is detected based on a comparison of signal strength in upper and lower adjacent passbands which have substantially equal levels if intermodulation is present.

12 Claims, 4 Drawing Sheets

INTERMODULATION CONTROLLER FOR RADIO RECEIVER

This application is related to commonly assigned applications Ser. No. 07/740242 entitled "AUTOMATIC GAIN CONTROL FOR RF AMPLIFIER" and Ser. No. 07/740172 entitled "ADJACENT CHANNEL CONTROLLER FOR RADIO RECEIVER", filed concurrently herewith and incorporated herein by reference.

BACKGROUND OF THE INVENTION

The present invention relates in general to detecting and reducing the effects of intermodulation distortion in a radio receiver, and more specifically to maintaining intermodulation distortion below a predetermined distortion while maintaining the level of a desired channel signal to above a predetermined level.

A persistent problem in the art of radio reception has been the creation of intermodulation distortion by radio receivers. Whenever two electrical signals having different frequencies are applied to any nonlinear device, mixing of the signals gives rise to mixing products at the sum and difference frequencies of the original signals. In a radio receiver, it is impractical to produce amplifiers and other components which are completely linear. Furthermore, other components, such as filters, depend on nonlinearities for their operation.

Whenever a receiver is receiving at least two RF broadcast signals within its RF bandwidth, mixing products at the sum and difference frequencies can potentially be created which propagate through the receiver with the broadcast signals. Whenever the two frequencies are close in frequency and large in signal strength, it is possible that the mixing products will include frequencies spanning a desired RF broadcast signal at a third frequency. The mixing products add to the desired RF broadcast signal giving rise to what is known as intermodulation distortion or intermodulation interference.

Most radio receivers have been equipped with an RF front end having a fixed bandwidth sufficiently wide to accept the entire RF broadcast band which it will receive. One technique which has been used to reduce the susceptibility of radio receivers to intermodulation distortion is to instead use a tunable RF filter having a bandwidth narrower than the entire RF band. By properly tuning the resonant frequency of the tunable RF filter, a desired RF signal is received while other signals in the particular broadcast band are rejected. This improves selectivity, image rejection, and intermodulation performance of the receiver. Nevertheless, it is not feasible to construct tuned RF filters of a sufficiently narrow passband to eliminate all signals other than the desired signal (i.e., having a passband with the width of a single channel or even just a few channels). This is especially true for the FM broadcast band due to its high frequencies in the range of from 88 MHz to 108 MHz.

Intermodulation distortion can also be favorably reduced through use of the automatic gain control (AGC) circuit which is common in radio receivers. An AGC control signal is generated which controls the forward gain of the radio signal amplification. When the gain applied to the RF signals is reduced, the intermodulation products are reduced to a greater degree. However, the improvement in intermodulation distortion is often obtained at the expense of overly-reducing the desired signal.

The AGC control signal has been generated in dependence on the received signal strength in the received RF frequency band, i.e, a plurality of channels not limited to the desired signal. Since the amount of signal strength in the desired signal versus signals in other channels which could cause intermodulation distortion is unknown, an AGC control signal can be generated based only on prior approximations of intermodulation distortion likely to be encountered.

It has been proposed to infer the presence of intermodulation distortion by measuring RF signal strength in various channels surrounding the desired signal. For example, in Sakai et al U.S. Patent No. 4,654,884, a radio receiver is disclosed which performs a scan tuning operation in search of any nondesired channels having a strong received signal therein. Based on the known frequency of the desired channel and the frequencies of any nondesired channels which are identified having a strong signal therein. The radio receiver then examines the signal strength at those nondesired frequencies that when paired with the strong signals would create intermodulation distortion in the desired channel. Thus, the presence of intermodulation distortion is inferred if conditions exist for creating it. However, this technique is unreliable since intermodulation distortion is not measured directly. Either two separate receivers or interruption of the reception of the desired signal is required. Furthermore, this technique results in a large increase of complexity and cost in the radio receiver.

SUMMARY OF THE INVENTION

It is a principal object of the present invention to provide a radio receiver with less susceptibility to intermodulation distortion.

It is another object of the present invention to detect the presence of intermodulation distortion with few added components, little added complexity, and without retuning the receiver.

It is a further object of the present invention to provide methods and apparatus for reducing intermodulation distortion without overly reducing the strength of the desired signal.

These and other objects are achieved using an intermodulation detector having a filter means for receiving radio broadcast signals and for filtering them to derive a lower channel signal, a desired channel signal, and an upper channel signal. The received signal strength of these signals are determined by level detecting the filtered signals to produce a lower channel level, a desired channel level, and an upper channel level. The lower channel level and the upper channel level are compared to determine whether the lower channel level and the upper channel level are substantially equal and are above a predetermined threshold as an indication of the presence of intermodulation distortion. The predetermined level is preferrably proportional to the desired channel level. In one embodiment of the invention, the passband of a tunable RF filter can be shifted in a manner to reduce intermodulation distortion without adversely affecting the signal level of the desired channel signal.

BRIEF DESCRIPTION OF THE FIGURES OF THE DRAWINGS

The novel features of the invention are set forth with particularity in the appended claims. The invention itself, however, both as to its organization and method of operation together with further objects and advantages thereof, may best be understood by reference to the following description taken in conjunction with the accompanying drawings in which:

DETAILED DESCRIPTION OF PREFERRED EMBODIMENTS

Figure 1:
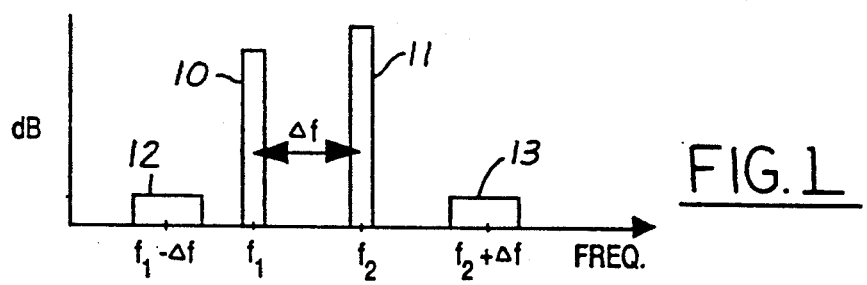
FIG. 1 is a plot showing power spectra for two broadcast signals and the resulting mixing products appearing in a radio receiver.

FIG. 1 shows the signal amplitude or signal level plotted according to frequency of signals present in the RF portion of a radio receiver. A first RF broadcast signal 10 has a center frequency $f_1$ and a second RF broadcast signal 11 has a center frequency $f_2$. Broadcast signals 10 and 11 are separated by a frequency difference $\Delta f$. The nonlinear elements in the RF section of the radio receiver generate mixing products from broadcast signals 10 and 11, specifically, mixing products 12 having a center frequency at $f_1 - \Delta f$ and mixing products 13 having a center frequency at $f_2 + \Delta f$. Mixing products 12 and 13 are known as intermodulation distortion. Since each frequency in broadcast signal 10 mixes with each frequency in broadcast signal 11, the width of the intermodulation distortion signals at 12 and 13 is about equal to the sum of the bandwidths of the broadcast signals.

Figure 2:
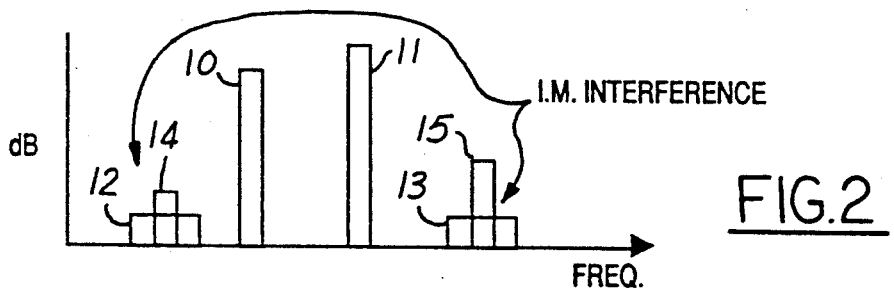
FIG. 2 is a plot showing the coincidence of mixing products with other broadcast signals, giving rise to intermodulation distortion.

As shown in FIG. 2, RF broadcast signals 14 or 15 may coincide with mixing products 12 or 13 giving rise to intermodulation distortion interference when it is desired to receive either broadcast signals 14 or 15.

Figure 3:
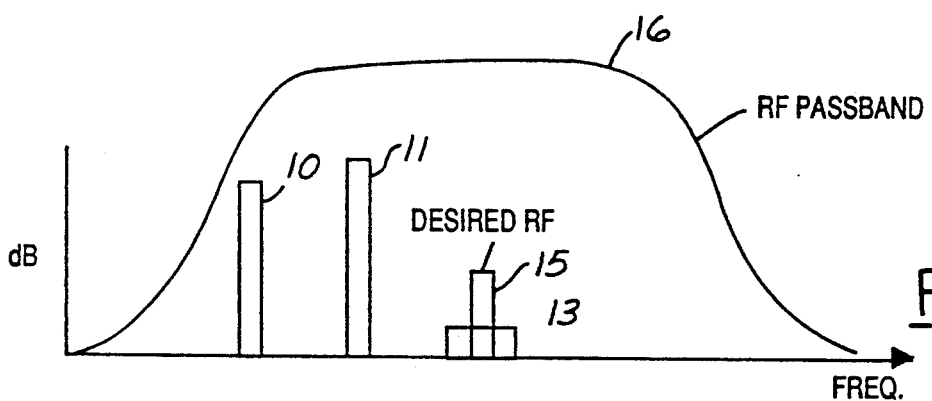
FIG. 3 is a plot showing the presence of intermodulation distortion interfering with the desired signal in a prior art radio receiver.

In FIG. 3, a curve 16 shows the gain versus frequency characteristic provided with a tunable RF filter which is centered on the frequency of a desired RF signal 15 to be received by a radio receiver. RF broadcast signals 10 and 11 are also located within the passband of the tunable RF filter; and since the filter and any RF amplifier in the receiver are partially nonlinear, intermodulation distortion occurs at 13.

Figure 4:
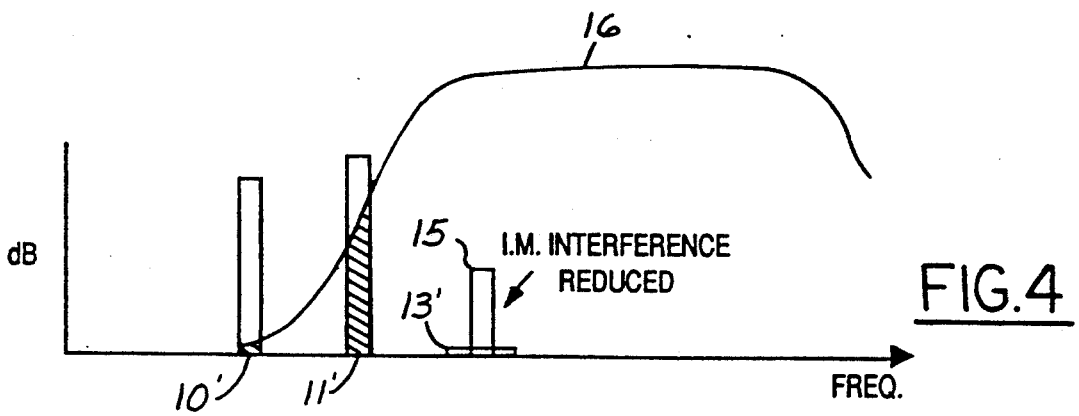
FIG. 4 is a plot showing the reduction of intermodulation interference obtained by shifting the RF filter passband according to the present invention.

FIG. 4 illustrates the retuning of RF passband 16 such that broadcast signals 10 and 11 are attenuated by the RF filter to the levels show by cross-hatched areas 10′ and 11′, while desired RF signal 15 is substantially unaffected. Due to the reduced levels of broadcast signals 10 and 11, intermodulation distortion at 13′ is greatly reduced. Thus, the present invention takes advantage of the fact that the pair of broadcast signals creating intermodulation distortion interfering with the desired signal must both be located on the same side of the desired signal in the frequency domain. Therefore, a shifted RF passband such that the desired signal is not at the center of the passband can be utilized to attenuate the signals that would otherwise give rise to intermodulation distortion.

Figure 5:
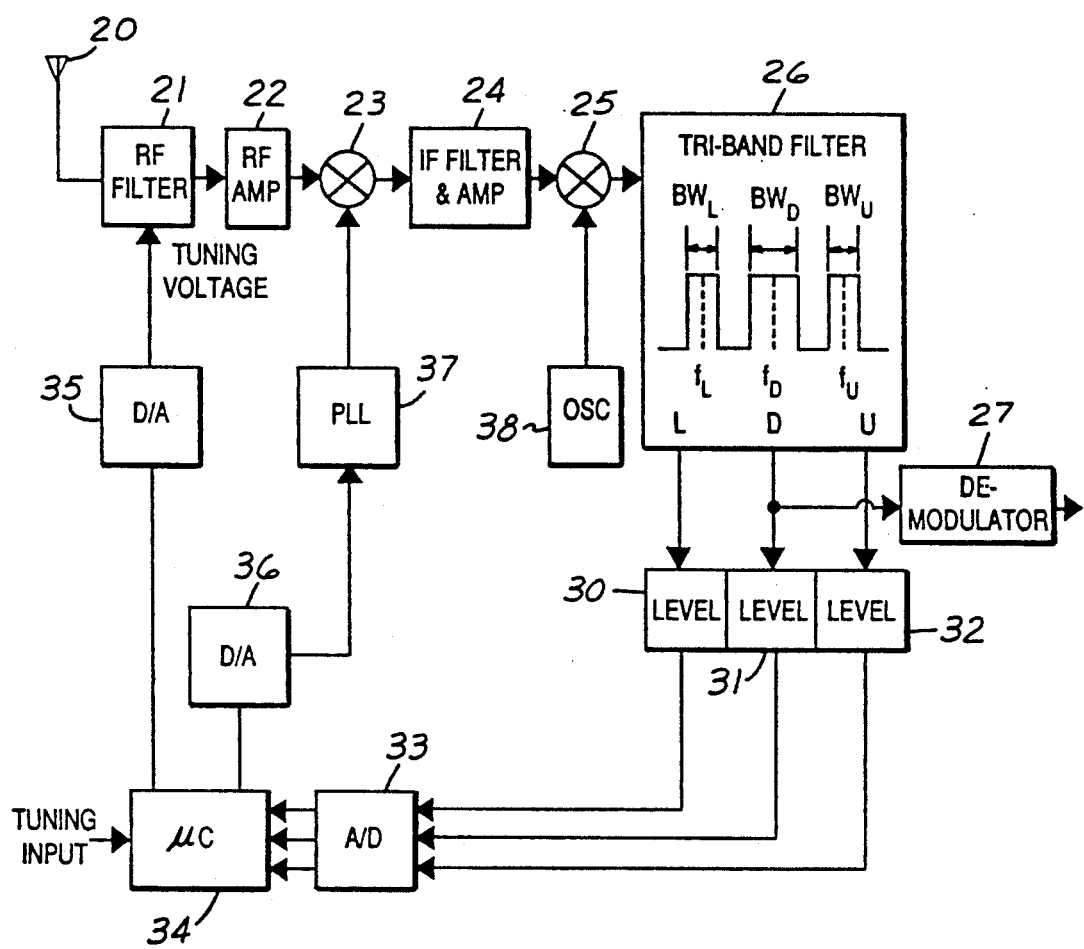
FIG. 5 is a block diagram of a radio receiver constructed according to the present invention.

Apparatus for detecting and controlling intermodulation distortion is shown in FIG. 5. The receiving antenna 20 is connected to a tunable RF filter 21. Filtered RF broadcast signals are provided from RF filter 21 through an RF amplifier 22 to a mixer 23. The resulting first intermediate frequency (IF) signals are provided to an IF filter and amplifier 24 and thereafter to a second mixer 25. Signals at a second intermediate frequency are provided to a tri-band filter 26 having three distinct passbands and generating a desired channel signal D, a lower channel signal L, and an upper channel signal U. Desired channel signal D is provided to a demodulator 27 and a level detector 31. Lower channel signal L and upper channel signal U are provided to level detectors 30 and 32, respectively. The outputs of level detectors 30–32 are connected to an analog-to-digital (A/D) converter 33, the output of which is connected to a microcontroller 34.

Microcontroller 34 is connected to a digital-to-analog (D/A) converter 35 which generates a tuning voltage for controlling RF filter 21 according to a digital value received from microcontroller 34. Microcontroller 34 is further connected to a D/A converter 36 for controlling a tunable phased locked loop (PLL) 37. A variable frequency output signal is provided from PLL 37 to an input of mixer 23. A fixed oscillator 38 generates a fixed frequency signal which is applied to an input of second mixer 25.

The receiver shown in FIG. 5 is known as a double frequency conversion, superheterodyne receiver. A first intermediate frequency from mixer 23 is preferably located at about 10.7 MHz in order to provide image rejection as is known in the art. The second intermediate frequency from mixer 25 is selected to be at about 2 MHz or less, whereby a tri-band filter 26 can be constructed with inexpensive components to Provide the separate passbands employed by the present invention. The bandwidth of RF filter 21, RF amplifier 22, and IF filter and amplifier 24 are sufficiently large to include adjacent channel signals on either side of a desired signal.

A center passband of tri-band filter 26 corresponds to a desired signal $f_D$ (located at the second intermediate frequency after mixing) and has a bandwidth $BW_D$ of about 150 kHz for an FM receiver so as to include all the desired channel signals. A lower adjacent channel signal is isolated by a lower passband centered on a lower adjacent channel frequency $f_L$ having a bandwidth $BW_L$ of from about 5 kHz to about 20 kHz. In a preferred embodiment, lower frequency $f_L$ may be about 112 kHz less than frequency $f_D$. An upper adjacent channel passband having a center frequency $f_U$ and a bandwidth $BW_U$ is located symmetrically about frequency $f_D$ with the lower adjacent channel passband.

The tri-band filter output is comprised of a desired channel signal D, a lower channel signal L, and an upper channel signal U. Level detectors 30–32 determine the peak signal strength level of each tri-band filter output and provide the level information to A/D converter 33. The analog signal levels are digitized, and the digital signals are provided to microcontroller 34 which processes the signals in order to determine the presence of intermodulation distortion.

In response to a tuning input, microcontroller 34 provides a digital command to D/A converter 36 so that PLL 37 mixes a desired RF signal to the first intermediate frequency of the receiver as is known in the art. Based on the known frequency of the desired signal, microcontroller 34 also provides a digital command to D/A converter 35 to generate a tuning voltage for RF filter 21 so that the variable RF passband of RF filter 21 includes (i.e., is initially centered on) the desired signal. The tuning voltage may be provided to a varactor within a tunable filter as is known in the art.

The present invention detects the presence of intermodulation distortion by performing certain comparisons of the signal levels from level detectors 30-32. In particular, it will be recognized that since the intermodulation distortion occupies a bandwidth spanning the bandwidth of the desired signal, the presence of intermodulation distortion can be detected if there is a signal present in each of the lower adjacent channel passband and the upper adjacent channel passband and if the signal level measured in each passband is substantially equal. In the preferred embodiment of FIG. 5, microcontroller 34 determines whether the lower channel level and the upper channel level are substantially equal by subtracting their respective digital values. If the absolute value of the difference is less than a predetermined difference, then the levels are substantially equal. Detection of intermodulation distortion is further conditioned on the lower channel level and upper channel level being above some predetermined value greater than the level of any random noise affecting the desired signal. Preferably, the noise threshold is a variable which is proportional to the desired signal level.

Figure 6:
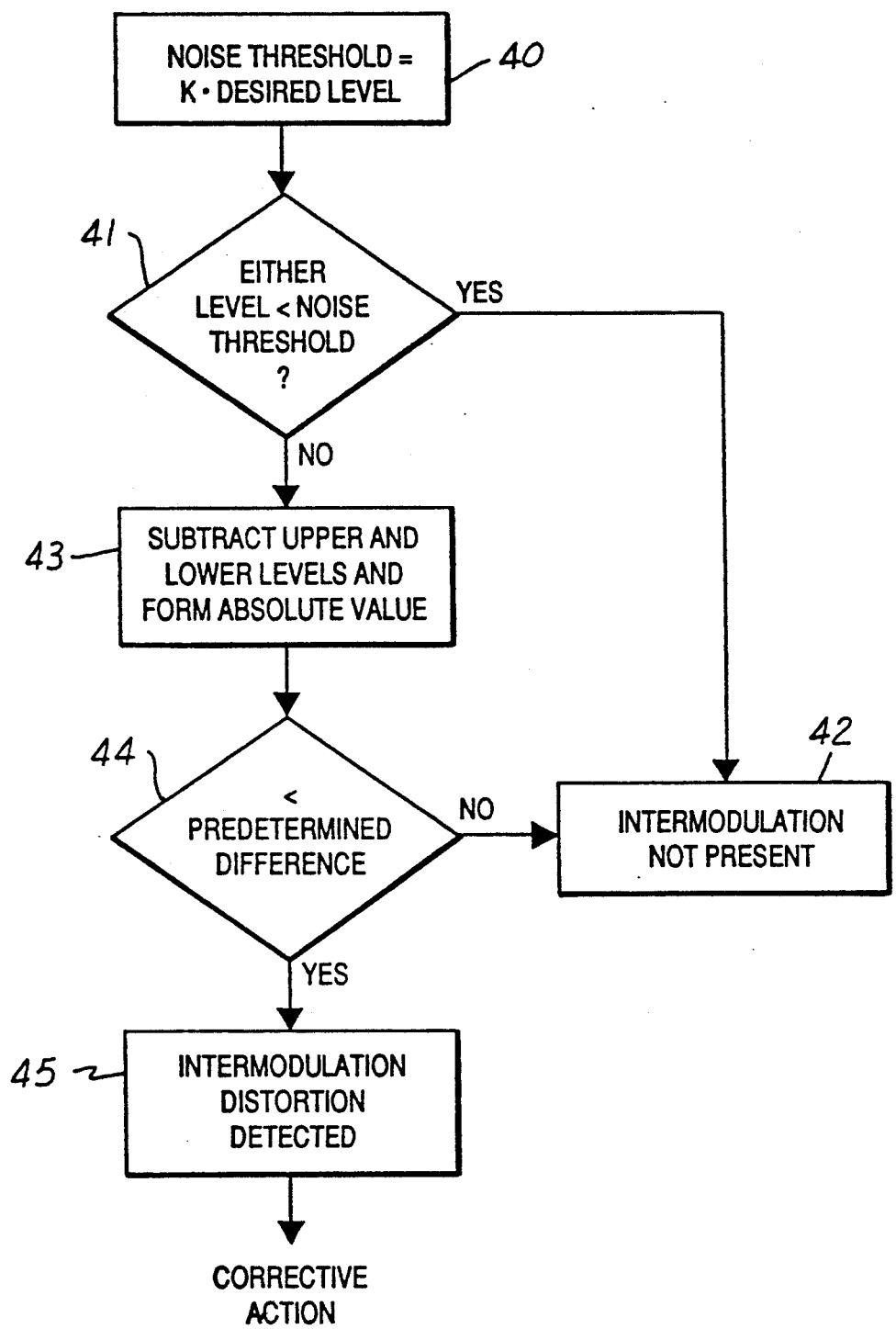
FIG. 6 is a flow chart illustrating the reduction of intermodulation distortion interference according to the present invention.

A preferred method for detecting intermodulation distortion used by microcontroller 34 is shown in greater detail in FIG. 6. In step 40, a noise threshold is calculated by multiplying the digital value of the desired level by a predetermined constant k. In step 41, both the lower channel level and the upper channel level are compared to the noise threshold. If either level is less than the noise threshold, then an indication is made in step 42 that intermodulation is not present. If both levels are greater than the noise threshold, then the method proceeds to step 43 wherein the upper channel level and the lower channel level are subtracted and the absolute value is taken of the resulting difference. In step 44, the absolute value is compared to a predetermined difference. If the absolute value is less than the predetermined difference, then an indication that intermodulation distortion is being detected is made in step 45; otherwise an indication is made in step 42 that intermodulation distortion is not present. When intermodulation distortion is detected in step 45, subsequent corrective action can be taken.

Corrective action may include adjustment of the automatic gain control signal as described in copending application Ser. No. 07/740242; however, a preferred corrective action involves the shifting of a RF passband in the manner described with reference to FIG. 4.

Figure 7:
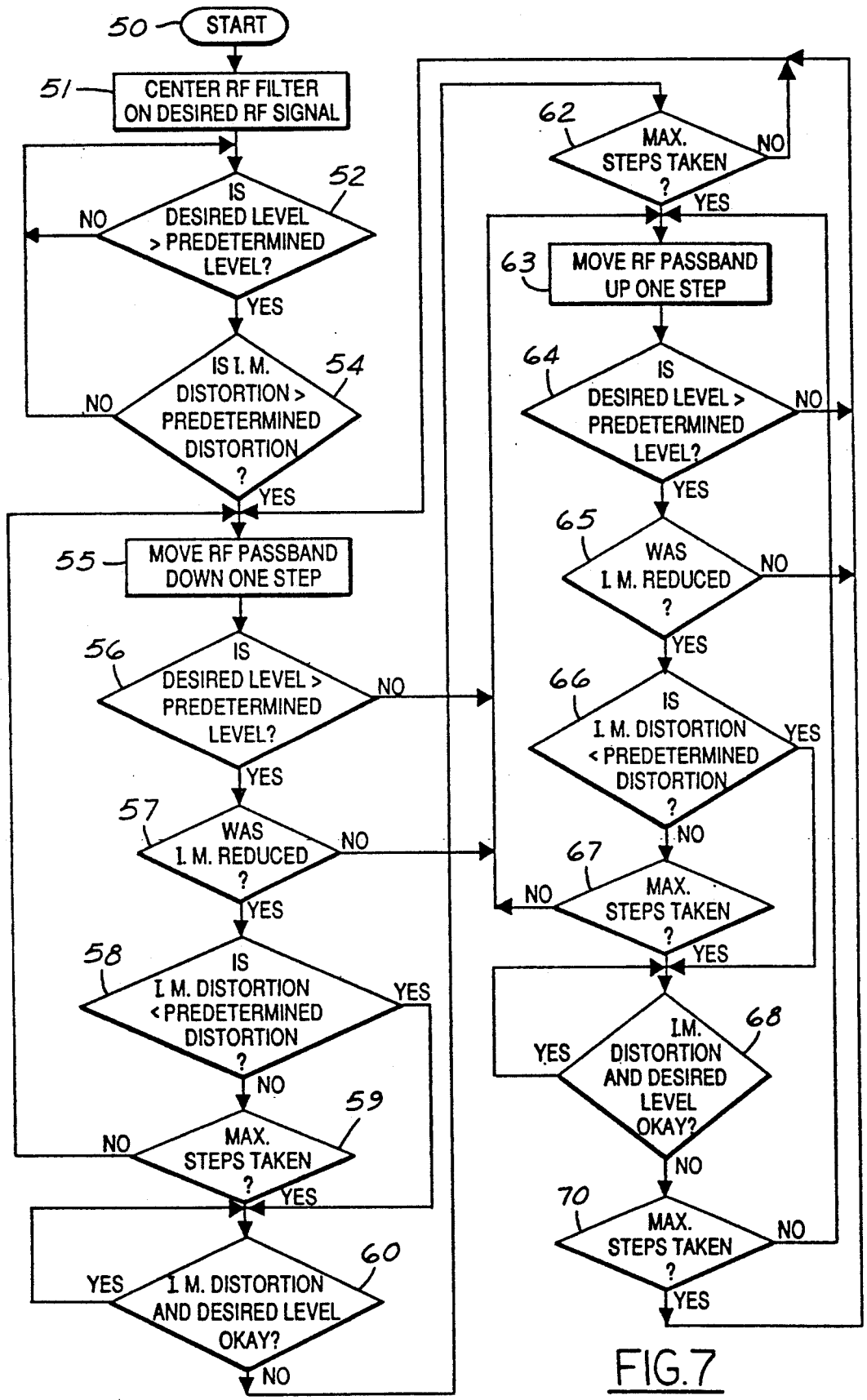
FIG. 7 is a flow chart illustrating the preferred method employed by the microcontroller of FIG. 5.

FIG. 7 illustrates a preferred method employed in microcontroller 34 of FIG. 5 for shifting the RF passband to eliminate or minimize intermodulation distortion without adversely affecting reception of the desired signal. The method starts in step 50 and centers the RF filters passband on the desired RF signal in step 51. The bandwidth of a typical tunable RF filter may preferably be about 3 MHz.

In step 52, the microcontroller checks the desired signal level by comparing it to a predetermined level corresponding to the minimum signal strength of the desired signal. When the desired level is greater than the predetermined level, a check for intermodulation distortion above a predetermined distortion is made in step 54. As long as the desired signal is weak (i.e., less than the predetermined level) and intermodulation distortion is not present, these conditions are repeatedly rechecked in steps 52 and 54.

If a strong desired signal and a predetermined amount of intermodulation distortion are each present, then a trial and error approach to shifting of the RF passband is begun in step 55 wherein the RF passband is moved down one step. The preferred step size in the present invention is about 500 kHz per step. The maximum shifting of the passband is about 5 MHz, i.e., a maximum of ten steps away from the centered position of the RF passband are allowed. After moving the RF passband down one step and after waiting about 50 microseconds to allow the radio circuits to resettle, the desired level is again checked with respect to the predetermined level in step 56. If the desired level is still satisfactory, then a check is made in step 57 to determine whether intermodulation distortion was reduced by moving the RF passband downward. Thus, the lower channel level or upper channel level is compared to its last value prior to moving the passband. If the level was reduced., then intermodulation distortion also was reduced. If either the desired level fell below the predetermined level or the level or intermodulation distortion was not reduced, then the method proceeds to step 63 for reversing the direction of shifting the passband, as will be described below. However, if intermodulation distortion was reduced, then a check is made in step 58 to determine whether the intermodulation distortion was reduced to below the predetermined distortion. If intermodulation is still objectionable, then a check is made in step 59 to determine whether the maximum downward steps have been taken. If the maximum downward shift has not yet been reached, then a return is made to step 55 for stepping the passband down another step.

If either the intermodulation distortion is reduced to below the predetermined distortion or if the maximum downward steps have been taken, then a holding loop is entered at step 60 to maintain the RF passband at its present downward shift until either the intermodulation distortion level or the desired signal level are no longer acceptable. As long as the intermodulation distortion and desired level are satisfactory, then a continuous loop is executed in step 60 which may include a delay or the if desired. When either the desired level level of intermodulation distortion is no longer satisfactory, a check is made in step 62 for determining whether the maximum downward steps have been taken. If not, then a return is made to step 55 for further downward shifting of the RF passband in an attempt to eliminate the intermodulation distortion.

If the downward shifting has already been performed to its maximum downward position, then upward shifting of the RF passband is begun in step 63 which also includes a delay of about 50 microseconds to allow the radio circuits to stabilize at the new setting of the RF passband. Upward shifting of the RF passband in step 63 can also follow from steps 56 and 57 in the event that a downward shift of the RF passband either caused the desired level to fall below the predetermined level or failed to reduce to intermodulation distortion. In step 64, the desired level is checked against the predetermined level and a reduction in intermodulation distortion is tested for in step 65. A negative result in either step 64 or 65 results in a return to step 55 for downward shifting of the passband. If intermodulation distortion was improved by the upward shifting of the passband, then a check is made in step 66 to determine if intermodulation distortion was reduced to below the predetermined distortion level. If it was, then a holding and checking loop is entered in step 68; otherwise, a check is made in step 67 to determine whether the maximum upward steps have been taken. If the maximum steps have been taken in the upward direction, then the holding loop is entered at step 68; otherwise, a return is made to step 63 for further upward shifting of the passband.

When the holding loop test in step 68 determines that the present positioning of the RF passband is no longer providing a satisfactory result, then a check is made in step 70 to determine whether the maximum upward steps have been taken. If not, then a return is made to step 63 for further upward shifting of the passband; otherwise, the method returns to step 55 for downward shifting of the passband.

It is possible that oscillation between upward and downward shifting of the passband may occur under certain conditions. So that any oscillations will not result in audible effects which would be noticed by a listener, it is preferable that the shifting of the passband occur at a rate higher than would be audible to the human ear. Thus, the method should be executed at a speed sufficient to cause the stepping of the RF passband to occur at a rate of about 20 kHz or higher, i.e., there should be no more than 50 microseconds between steps.

According to the method in FIG. 7, if shifting of the RF passband reduces intermodulation distortion, then the passband will, through trial and error, be located at an optimum position where such distortion is either eliminated or reduced to its maximum possible extent without causing the desired level to be reduced to an unacceptable level. When a radio receiver is retuned to a new desired channel, then the method is repeated beginning at step 50.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. An intermodulation detector for a radio broadcast receiver comprising:
    filter means for receiving radio broadcast signals and for filtering said radio broadcast signals to derive a lower adjacent channel passband signal, a desired channel signal, and an upper adjacent channel passband signal, said upper and lower adjacent channel passbands being substantially symmetrical about said desired channel;
    level detecting means coupled to said filter means for level detecting said filtered signals to produce a lower channel level and an upper channel level; and
    comparing means for comparing said lower channel level and said upper channel level to determine whether said lower channel level and said upper channel level are substantially equal and are above a predetermined level.

2. The detector of claim 1 wherein said level detecting means further produces a desired channel level, and wherein said predetermined level is proportional to said desired channel level.

3. A radio receiver for receiving transmitted radio-frequency (RF) signals including a desired signal, said receiver comprising:
    tuned RF filter means for filtering said RF signals, said tuned RF filter means having a variable RF passband responsive to a control signal;
    tri-band filter means coupled to said tuned RF filter means for producing a lower adjacent channel passband signal, a desired channel signal, and an upper adjacent channel passband signal, said upper and lower adjacent channel passband signal, said upper and lower adjacent channel passbands being substantially symmetrical about said desired channel;
    tri-band level detecting means coupled to said tri-band filter means for producing a lower channel level, a desired channel level, and an upper channel level; and
    control means coupled to said tuned RF filter means and said tri-band level detecting means for generating said control signal such that said variable RF passband includes said desired signal and for detecting the occurrence of intermodulation distortion affecting said desired signal, said control means initially locating said variable RF passband such that said desired signal is centered in said variable RF passband and then shifting said variable RF passband to reduce intermodulation distortion in the event that intermodulation distortion occurs above a predetermined distortion.

4. The receiver of claim 3 wherein said control means stops shifting said variable RF passband in any one direction if said desired channel level falls below a predetermined level.

5. A radio receiver for receiving transmitted radio-frequency (RF) signals including a desired signal, said receiver comprising:
    tuned RF filter means for filtering said RF signals, said tuned RF filter means having a variable RF passband responsive to a control signal;
    tri-band filter means coupled to said tuned RF filter means for producing a lower channel signal, a desired channel signal, and an upper channel signal;
    tri-band level detecting means coupled to said tri-band filter means for producing a lower channel level, a desired channel level, and an upper channel level;
    analog-to-digital converter means coupled to said tri-band level detecting means for digitizing said lower channel level, said desired channel level, and said upper channel level;
    a microcontroller coupled to said analog-to-digital converter means for generating said control signal to control said variable RF passband and for detecting the occurrence of intermodulation distortion in response to said lower channel level and said upper channel level being substantially equal and above a predetermined threshold; and
    digital-to-analog converter means coupled to said microcontroller and said tuned RF filter means for converting said control signal to an analog voltage.

6. The receiver of claim 5 wherein said microcontroller is programmed to initially locate said variable RF passband such that said desired signal is centered in said variable RF passband and then shift said variable RF passband to reduce intermodulation distortion in the event that intermodulation distortion is detected.

7. The receiver of claim 6 wherein said microcontroller is programmed to stop shifting said variable RF passband in any one direction if said desired channel level falls below a predetermined level.

8. A method for detecting intermodulation distortion in a radio receiver comprising the steps of:
receiving transmitted radio-frequency (RF) signals;
filtering said radio broadcast signals to derive a lower channel signal, a desired channel signal, and an upper channel signal using upper and lower passbands substantially symmetrical about a desired channel passband;
level detecting said filtered signals to produce a lower channel level, a desired channel level, and an upper channel level; and
detecting the occurrence of intermodulation distortion when said lower channel level and said upper channel level are substantially equal and are above a predetermined level.

9. The method of claim 8 wherein said predetermined level is proportional to said desired channel level.

10. A method for reducing intermodulation distortion in a receiver for receiving transmitted radio-frequency (RF) signals including a desired signal, said method comprising the steps of:
filtering said RF signals in a tuned RF filter having a variable RF passband;
mixing said filtered RF signals to produce intermediate-frequency (IF) signals;
tri-band filtering said IF signals to derive a lower channel signal, a desired channel signal, and an upper channel signal;
level detecting said tri-band filtered IF signals to produce a lower channel level, a desired channel level, and an upper channel level;
tuning said variable RF passband such that said desired signal is centered in said variable RF passband;
shifting the frequency range of said variable RF passband in a first direction while said desired channel level is above a predetermined level and while said lower channel level and said upper channel level are substantially equal but decreasing, and stopping said shifting when either said desired channel level falls below said predetermined level, said lower channel level and said upper channel level are no longer substantially equal, or said lower channel level and said upper channel level fall below a threshold;
if said intermodulation distortion is not reduced while shifting in said first direction, then recentering said variable RF passband with said desired signal and repeating said shifting step but shifting said variable RF passband in a second direction opposite said first direction.

11. A method for detecting intermodulation distortion in an FM radio receiver comprising the steps of:
receiving transmitted radio-frequency signals;
mixing said radio-frequency signals to produce an intermediate frequency (IF) signal with a center frequency $f_D$;
filtering said IF signal in a desired passband filter with a center frequency $f_D$ and a bandwidth of about 150 kHz to produce a desired channel signal;
filtering said IF signal in a lower passband filter having a passband lower than the passband of said desired passband filter and having a bandwidth between about 5 and 20 kHz to produce a lower passband signal;
filtering said IF signal in an upper passband filter with a passband higher than the passband of said desired passband filter and having a bandwidth between about 5 and 20 kHz to produce an upper passband signal;
level detecting said lower and upper passband signals to produce a lower passband level and an upper passband level, respectively; and
detecting the occurrence of intermodulation distortion when said lower passband level and said upper passband level are substantially equal and are above a predetermined level.

12. The method of claim 11 wherein said lower passband filter has a center frequency about 112 kHz less than frequency $f_D$ and said upper passband filter has a center frequency about 112 kHz greater than frequency $f_D$.

* * * * *